United States Patent
Iida et al.

(10) Patent No.: US 9,136,252 B2
(45) Date of Patent: Sep. 15, 2015

(54) SEMICONDUCTOR DEVICE (71) Applicant: KABUSHIKI KAISHA TOSHIBA, Tokyo (JP)

(72) Inventors: Akihiro Iida, Kanagawa (JP); Akihito Ishimura, Kanagawa (JP); Hiroshi Inagaki, Kanagawa (JP)

(73) Assignee: Kabushiki Kaishi Toshiba, Tokyo (JP)

( * ) Notice: Subject to any disclaimer, the term of this patent is extended or adjusted under 35 U.S.C. 154(b) by 0 days.

(21) Appl. No.: 14/015,352

(22) Filed: Aug. 30, 2013

(65) Prior Publication Data

US 2014/0197550 A1  Jul. 17, 2014

(30) Foreign Application Priority Data

Jan. 15, 2013  (JP) ................................ 2013-004876

(51) Int. Cl.
| | |
|---|---|
| *H01L 23/49* | (2006.01) |
| *H01L 25/065* | (2006.01) |
| *H01L 25/16* | (2006.01) |
| *H01L 23/13* | (2006.01) |
| *H01L 23/16* | (2006.01) |
| *H01L 23/31* | (2006.01) |
| *H01L 25/18* | (2006.01) |
| *H01L 23/00* | (2006.01) |
| *H01L 23/498* | (2006.01) |

(52) U.S. Cl.
CPC ............ *H01L 25/0657* (2013.01); *H01L 23/13* (2013.01); *H01L 24/32* (2013.01); *H01L 25/0652* (2013.01); *H01L 25/0655* (2013.01); *H01L 25/16* (2013.01); *H01L 23/16* (2013.01); *H01L 23/3121* (2013.01); *H01L 23/49822* (2013.01); *H01L 24/06* (2013.01); *H01L 24/29* (2013.01); *H01L 24/45* (2013.01); *H01L 24/48* (2013.01); *H01L 24/49* (2013.01); *H01L 24/73* (2013.01); *H01L 25/18* (2013.01); *H01L 2223/6677* (2013.01); *H01L 2224/04042* (2013.01); *H01L 2224/06135* (2013.01); *H01L 2224/2919* (2013.01); *H01L 2224/32145* (2013.01); *H01L 2224/32225* (2013.01); *H01L 2224/32245* (2013.01); *H01L 2224/45144* (2013.01); *H01L 2224/48091* (2013.01); *H01L 2224/48145* (2013.01); *H01L 2224/48227* (2013.01); *H01L 2224/49175* (2013.01); *H01L 2224/73265* (2013.01); *H01L 2225/0651* (2013.01); *H01L 2225/06506* (2013.01); *H01L 2225/06562* (2013.01); *H01L 2924/15151* (2013.01); *H01L 2924/15159* (2013.01); *H01L 2924/19041* (2013.01); *H01L 2924/19043* (2013.01); *H01L 2924/19103* (2013.01); *H01L 2924/19105* (2013.01); *H01L 2924/3511* (2013.01)

(58) Field of Classification Search
CPC ........... H01L 2224/48227; H01L 2224/73265; H01L 2224/32225
See application file for complete search history.

(56) References Cited

U.S. PATENT DOCUMENTS

| | | | |
|---|---|---|---|
| 7,342,308 B2* | 3/2008 | Lam .............................. | 257/723 |
| 2006/0012018 A1* | 1/2006 | Karnezos et al. ............. | 257/678 |

(Continued)

*Primary Examiner* — Jaehwan Oh
(74) *Attorney, Agent, or Firm* — Patterson & Sheridan, LLP (57) ABSTRACT

A semiconductor device includes a substrate having a first surface, a height adjuster mounted on the first surface of the substrate via a first adhesive layer, a semiconductor chip mounted on the height adjuster via a second adhesive layer, an electronic component mounted on the first surface of the substrate via a third adhesive layer, a bonding wire, and a sealing member. The length of the electronic component in a first direction corresponding to the thickness direction of the substrate is larger than the length of the semiconductor chip in the first direction, and the sum of the lengths of the height adjuster, the second adhesive layer, and the semiconductor chip in the first direction is larger than the length of the electronic component in the first direction.

13 Claims, 7 Drawing Sheets

(56) References Cited

U.S. PATENT DOCUMENTS

| | | | |
|---|---|---|---|
| 2007/0114672 A1* | 5/2007 | Higashino et al. | 257/777 |
| 2008/0296779 A1* | 12/2008 | Matsui et al. | 257/777 |
| 2009/0155960 A1* | 6/2009 | Chow et al. | 438/127 |
| 2012/0056335 A1* | 3/2012 | Gillingham | 257/777 |
| 2012/0317332 A1* | 12/2012 | Kwak et al. | 711/102 |
| 2013/0093103 A1* | 4/2013 | Kim et al. | 257/777 |

* cited by examiner

SEMICONDUCTOR DEVICE

CROSS-REFERENCE TO RELATED APPLICATION

This application is based upon and claims the benefit of priority from Japanese Patent Application No. 2013-004876, filed Jan. 15, 2013, the entire contents of which are incorporated herein by reference.

FIELD

Embodiments described herein relate generally to a semiconductor device.

BACKGROUND

A manufacturing method of a packaged semiconductor device includes a step for positioning a semiconductor chip in a package, and sealing and retaining the semiconductor chip therein using thermosetting resin. During this step, the thermosetting resin causes shrinkage as it hardens due to a temperature change of the resin. This shrinkage applies stress to the semiconductor chip, producing a possibility of damage to the semiconductor chip.

DETAILED DESCRIPTION

In general, according to one embodiment, a semiconductor device includes a substrate, a height adjuster, a semiconductor chip, an electronic component, a bonding wire, and a sealing member covering these components. The substrate has a first surface and a second surface on a side opposite to the first surface. The height adjuster is mounted on the first surface of the substrate via a first adhesive layer. The semiconductor chip is mounted on the height adjuster via a second adhesive layer. The electronic component is mounted on the first surface of the substrate via a third adhesive layer and disposed apart from the height adjuster and the semiconductor chip. The bonding wire electrically connects a conductive pad disposed on the substrate and a conductive pad disposed on the semiconductor chip to electrically connect a conductive pad disposed on the substrate and a conductive pad disposed on the electronic component. The sealing member covers the substrate, the first adhesive layer, the height adjuster, the second adhesive layer, the semiconductor chip, the third adhesive layer, the electronic component, and the bonding wire. The length of the electronic component in a first direction corresponding to the thickness direction of the substrate is larger than the length of the semiconductor chip in the first direction. The sum of the lengths of the height adjuster, the second adhesive layer, and the semiconductor chip in the first direction is larger than the length of the electronic component in the first direction.

Embodiments are hereinafter described with reference to the drawings.

First Embodiment

Figure 1:
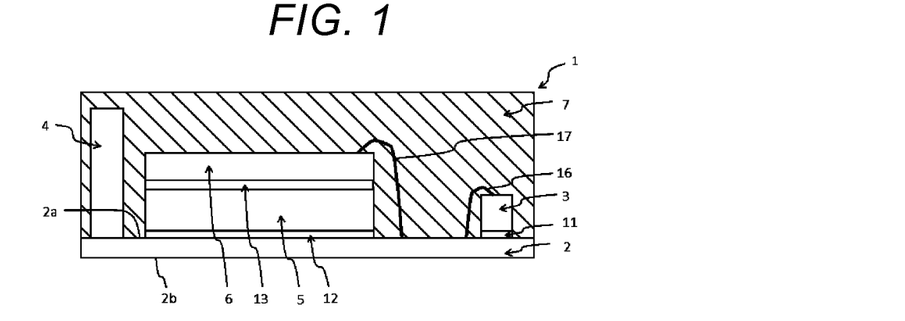
FIG. 1 is a cross-sectional view of a semiconductor device according to a first embodiment.
Figure 2:
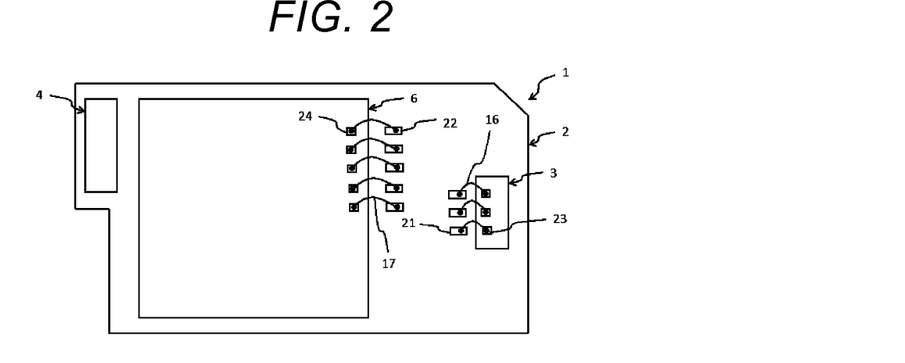
FIG. 2 is a plan view of the semiconductor device shown in FIG. 1.

FIGS. 1 and 2 illustrate a semiconductor device 1 according to a first embodiment. The semiconductor device 1 is constituted by a semiconductor memory device such as an NAND-type flash memory, for example. An example of the semiconductor device 1 is a micro SD card, an SD card, or other cards.

FIG. 1 is a cross-sectional view of the semiconductor device 1. FIG. 2 is a plan view of the semiconductor device 1. As illustrated in FIGS. 1 and 2, the semiconductor device 1 includes a substrate 2, a controller chip 3, a passive component 4, a height adjuster 5, a semiconductor chip 6, and a sealing member 7. In FIG. 1, the sealing member 7 is hatched for easy understanding of the explanation.

The substrate 2 (circuit board) has a base material made of glass epoxy resin, for example, and wiring patterns provided on the base material. The substrate 2 has a first surface 2a (mounting surface), and a second surface 2b on a side opposite to the first surface 2a. The first surface 2a and the second surface 2b are positioned substantially in parallel with each other and extend in the extension direction of the substrate 2. In other words, the first surface 2a and the second surface 2b extend in a direction crossing the thickness direction of the substrate 2 (such as a direction crossing the thickness direction substantially at right angles).

The first surface 2a of the substrate 2 has the wiring patterns. The second surface 2b of the substrate 2 has external connection terminals exposed to the outside of the semiconductor device 1, for example.

As illustrated in FIGS. 1 and 2, the controller chip 3 is attached to the first surface 2a of the substrate 2. The controller chip 3 corresponds to an example of a "component", an "electronic component", and a "first electronic component." As shown in FIG. 2, the controller chip 3 is located substantially at the center of the substrate 2 in the width direction.

The controller chip 3 controls the operation of the semiconductor chip 6. The controller chip 3 writes data to the semiconductor chip 6, reads data from the semiconductor chip 6, erases data from the semiconductor chip 6, and performs other processing in accordance with commands given from the outside to manage the memory condition of data in the semiconductor chip 6.

An adhesive layer 11 (first adhesive layer) is provided between the controller chip 3 and the first surface 2a of the substrate 2. The controller chip 3 is fixed to the first surface 2a of the substrate 2 via the adhesive layer 11. The controller chip 3 is electrically connected with the first surface 2a of the substrate 2 via bonding wires 16 (first bonding wires). The bonding wires 16 are made of gold, for example, but may be made of other materials.

The height adjuster 5 (first support member, carrying unit, stand, frame, or base) is attached to the first surface 2a of the substrate 2 apart from the controller chip 3. The height adjuster 5 is constituted by a dummy component (dummy chip), for example. More specifically, an example of the height adjuster 5 is an electronic component mounted on the substrate 2 and not electrically connected with the controller chip 3 and the semiconductor chip 6. There are no specific limitations as to the material of the dummy component. The height adjuster 5 extends substantially in parallel with the substrate 2, for example, but is not required to have this configuration. The height adjuster 5 is not limited to a dummy component but may be any parts capable of adjusting (positioning or supporting) the position (height) of the semiconductor chip 6 in the thickness direction of the substrate 2. For example, the height adjuster 5 may be constituted by a convex part (or a part of concave part) projecting from the surface of the substrate 2 such as a layer forming the substrate 2 and a film covering the surface of the substrate 2, or a coating (adhesive) hardened after being applied to the main part of the substrate 2. Furthermore, the height adjuster 5 is not limited to a dummy component but may be a component mounted on the substrate 2 with electric continuity between the height adjuster 5, and the substrate 2 and other electronic components while functioning. These examples of modification will be described below with reference to other figures.

An adhesive layer 12 (second adhesive layer) is provided between the height adjuster 5 and the first surface 2a of the substrate 2. The height adjuster 5 is fixed to the first surface 2a of the substrate 2 via the adhesive layer 12.

As illustrated in FIGS. 1 and 2, the semiconductor chip 6 is attached to the height adjuster 5 on a side opposite to the substrate 2. The semiconductor chip 6 is constituted by an arbitrary memory chip such as an NAND-type flash memory, for example. An adhesive layer 13 (third adhesive layer) is provided between the semiconductor chip 6 and the height adjuster 5. The height (thickness) of the semiconductor chip 6 is smaller than that of the controller chip 3. In the example of FIG. 1, the sum of the thicknesses of the controller chip 3 and the adhesive layer 11 is smaller than the sum of the thicknesses of the height adjuster 5, the adhesive layer 12, the semiconductor chip 6, and the adhesive layer 13. In the example of FIG. 1, the sum of the thicknesses of the height adjuster 5 and the adhesive layer 12 is smaller than the sum of the thicknesses of the controller chip 3 and the adhesive layer 11.

The passive component 4 is an example of a "component", an "electronic component", and a "second electronic component", for each. The passive component 4 is constituted by a capacitor or a resistance, for example, but is not limited thereto. As illustrated in FIG. 1, the passive component 4 is attached to the first surface 2a of the substrate 2 apart from the controller chip 3 and the height adjuster 5, and electrically connected with the substrate 2. In the example of FIG. 1, the height of the passive component 4 is larger than the sum of the thicknesses of the height adjuster 5 and the semiconductor chip 6. Moreover, in the example of FIG. 1, the height of the passive component 4 is larger than the sum of the thicknesses of the height adjuster 5, the adhesive layer 12, the semiconductor chip 6, and the adhesive layer 13.

As illustrated in FIGS. 1 and 2, the bonding wires 16 are provided between the substrate 2 and the controller chip 3. The bonding wires 16 correspond to an example of an "electrical connection member". Conductive pads 21 provided on the first surface 2a of the substrate 2 are connected with conductive pads 23 provided on the controller chip 3 via the bonding wires 16 to make electrical connection between the substrate 2 and the controller chip 3.

Similarly, bonding wires 17 (second bonding wires) are provided between the substrate 2 and the semiconductor chip 6. The bonding wires 17 correspond to an example of an "electrical connection member". Conductive pads 22 provided on the first surface 2a of the substrate 2 are connected with conductive pads 24 provided on the semiconductor chip 6 via the bonding wires 17 (second bonding wires) to make electrical connection between the substrate 2 and the semiconductor chip 6.

As illustrated in FIG. 1, the semiconductor device 1 includes the sealing member 7 (resin portion, mold, mold resin, or thermosetting resin). An example of the sealing member 7 is constituted by a resin (epoxy resin). The sealing member 7 covers the substrate 2, the controller chip 3, the passive component 4, the height adjuster 5, and the semiconductor chip 6.

In general, the sealing member 7 causes shrinkage when constituted by thermosetting resin as it hardens due to temperature change of the resin (hereafter also referred to as "hardening shrinkage") during the molding step. When the height difference between the semiconductor chip 6 and the passive component 4 is large, the volume of the sealing member 7 increases. As the volume of the sealing member 7 becomes larger, stress caused by hardening shrinkage is more easily applied to the semiconductor chip 6, producing a possibility of damage to the semiconductor chip 6. In addition, warping of the semiconductor device 1 (warping of package) may be generated due to the difference in the shrinkage rate between the substrate 2 and the semiconductor chip 6.

According to this embodiment, the semiconductor chip 6 is mounted on the height adjuster 5. In this case, the volume of the sealing member 7 does not easily increase even when the semiconductor chip 6 to be mounted is thin, for example. Accordingly, the effect (stress or damage) caused by hardening shrinkage decreases, wherefore damage to the semiconductor chip 6 and warping of the semiconductor 1 may lower.

Furthermore, according to the structure of the semiconductor device 1 in this embodiment provided with the height adjuster 5, the semiconductor device 1 may use such semiconductor chips not having passed the size examination in the manufacturing step of other semiconductor devices requiring higher accuracy of the semiconductor chip size than the corresponding accuracy of the semiconductor device 1 in this embodiment without increasing the thickness of the substrate 2 or changing other conditions. This advantage contributes to effective utilization of semiconductor chips.

Accordingly, the structure which includes the height adjuster 5 constituted by a dummy component, for example, may increase the degree of the design freedom of the semiconductor device 1. In addition, the structure according to this embodiment may use common metal molds and substrates even when the semiconductor chip 6 to be employed has a smaller thickness.

Another possible solution to reduce stress caused by the sealing member 7 so as to prevent damage and warping caused by hardening shrinkage is to increase the thickness (enlarge the volume) of the semiconductor chip 6.

Second Embodiment

The semiconductor device 1 according to a second embodiment is hereinafter described with reference to FIG. 3. Structures having functions identical or similar to the corresponding structures in the first embodiment are given similar reference numbers, and the same explanation of those is not repeated. Structures other than the structures touched upon herein are the same as the corresponding structures in the first embodiment.

Figure 3:
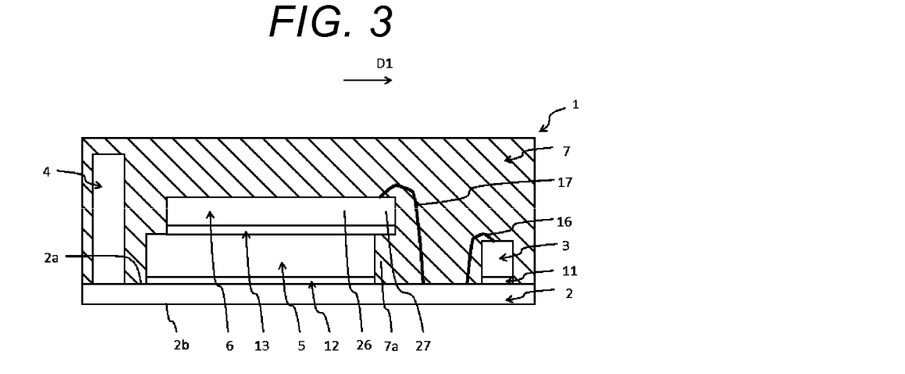
FIG. 3 is a cross-sectional view of a semiconductor device according to a second embodiment.

As illustrated in FIG. 3, the semiconductor chip 6 in this embodiment includes a first part 26 attached to the height adjuster 5, and a second part 27 positioned outside the height adjuster 5 in the extension direction of the substrate 2 and facing to the first surface 2a of the substrate 2. In this specification, the phrase "positioned outside (or inside) the height adjuster in the extension direction of the substrate" refers to the condition "positioned outside (or inside) the external shape of the height adjuster 5 as viewed in the plan view (i.e., as viewed in the thickness direction of the substrate). The second part 27 corresponds to a part projecting (protruding or overhanging) from the height adjuster 5, and does not overlap with the height adjuster 5 in the thickness direction of the substrate 2. The adhesive layer 13 is provided between the first part 26 and the height adjuster 5. The first part 26 is fixed to the height adjuster 5 via the adhesive layer 13, for example.

The second part 27 of the semiconductor chip 6 extends in a first direction D1 from the first part 26. The first direction D1 is a direction moving away from the passive component 4 mounted on the substrate 2.

According to this embodiment, a part 7a of the sealing member 7 lies between the second part 27 of the semiconductor chip 6 and the first surface 2a of the substrate 2. This arrangement allows the second part 27 of the semiconductor chip 6 to be supported by the sealing member 7, thereby increasing the reliability of the semiconductor device 1.

Accordingly, this structure may provide advantages similar to those of the first embodiment, and may also increase the degree of the design freedom. Moreover, the arrangement which allows projection of the second part 27 of the semiconductor chip 6 from the height adjuster 5 may increase the size of the semiconductor chip 6 mounted on the semiconductor device 1 (or decrease the size of the semiconductor device 1).

Figure 4:
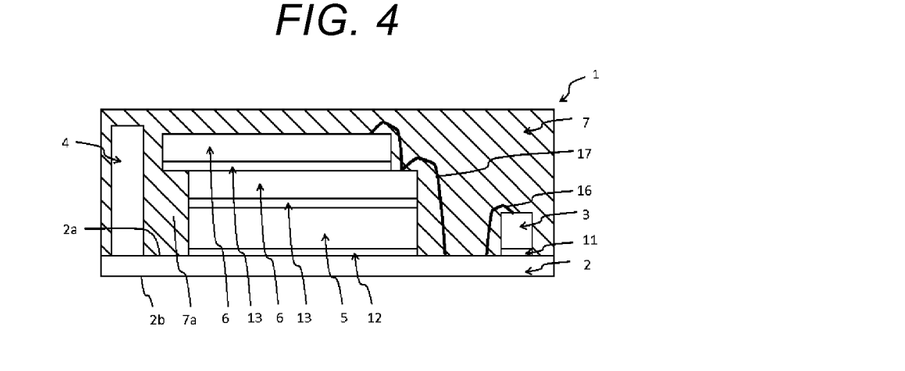
FIG. 4 is a cross-sectional view of a semiconductor device according to a modified example of the second embodiment.

FIG. 4 illustrates a modified example of the semiconductor device 1 according to the first or the second embodiment. As shown in FIG. 4, a plurality of the semiconductor chips 6 are mounted on the height adjuster 5 in this modified example instead of the one semiconductor chip 6. This structure may further increase the capacity of the semiconductor device 1.

Third Embodiment

The semiconductor device 1 according to a third embodiment is now explained with reference to FIG. 5. Structures having functions identical or similar to the corresponding structures in the first and the second embodiments are given similar reference numbers, and the same explanation of those is not repeated. Structures other than the structures touched upon herein are the same as the corresponding structures in the first embodiment.

Figure 5:
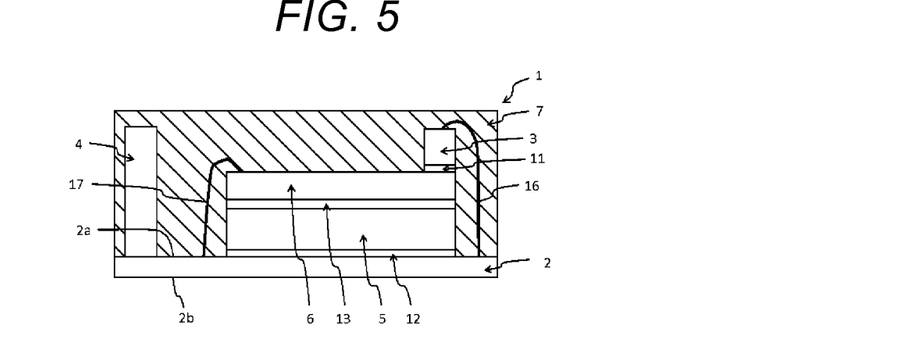
FIG. 5 is a cross-sectional view of a semiconductor device according to a third embodiment.

According to the semiconductor device 1 in this embodiment, the controller chip 3 is attached to the semiconductor chip 6 on the side opposite to the substrate 2 as illustrated in FIG. 5. The adhesive layer 11 is provided between the controller chip 3 and the semiconductor chip 6.

According to this structure, the necessity of holding the controller chip 3 by the substrate 2 is eliminated, wherefore the area of the substrate 2 is allowed to decrease. The substrate 2 occupies the largest proportion of the material cost of the semiconductor device 1. Accordingly, this structure may achieve not only the advantages similar to those of the first embodiment, but also lower the material cost of the semiconductor device 1 by reduction of the area of the substrate 2.

Fourth Embodiment

The semiconductor device 1 according to a fourth embodiment is now explained with reference to FIG. 6. Structures having functions identical or similar to the corresponding structures in the first through the third embodiments are given similar reference numbers, and the same explanation of those is not repeated. Structures other than the structures touched upon herein are the same as the corresponding structures in the first embodiment.

Figure 6:
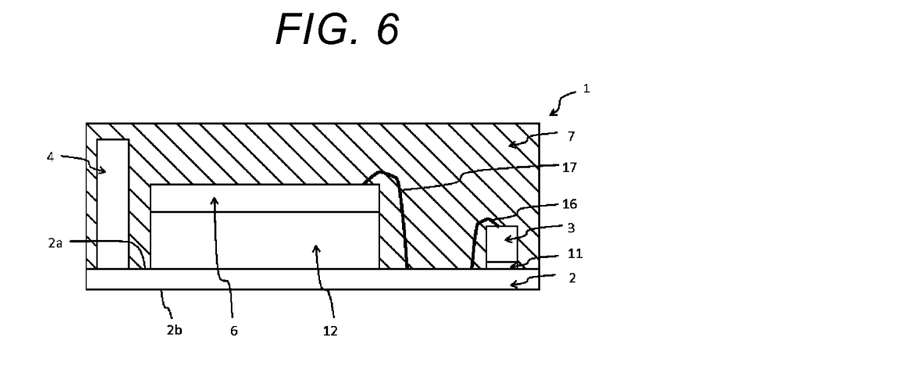
FIG. 6 is a cross-sectional view of a semiconductor device according to a fourth embodiment.

According to the semiconductor device 1 in this embodiment, the semiconductor chip 6 is mounted on the first surface 2a of the substrate 2 rather than attached to the height adjuster 5 on the side opposite to the substrate 2 as illustrated in FIG. 6. Even in such a structure which eliminates the height adjuster 5, the volume of the sealing member 7 does not easily increase when the thickness (volume) of the adhesive layer 12 provided between the semiconductor chip 6 and the first surface 2a of the substrate 2 becomes large. Accordingly, the effect of hardening shrinkage decreases, whereby damage to the semiconductor chip 6 and warping of the semiconductor device 1 may lower.

According to this structure, load applied to the semiconductor chip 6 decreases, and the degree of the design freedom of the product may increase similarly to the first embodiment.

Fifth Embodiment

The semiconductor device 1 according to a fifth embodiment is now explained with reference to FIG. 7. Structures having functions identical or similar to the corresponding structures in the first through the fourth embodiments are given similar reference numbers, and the same explanation of those is not repeated. Structures other than the structures touched upon herein are the same as the corresponding structures in the first embodiment.

Figure 7:
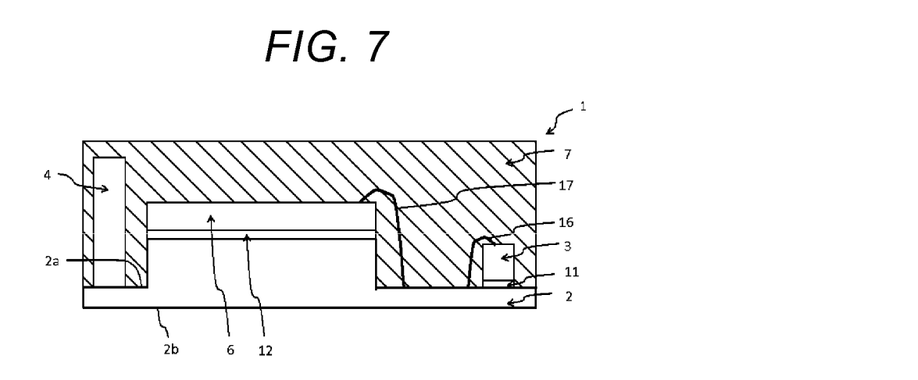
FIG. 7 is a cross-sectional view of a semiconductor device according to a fifth embodiment.

According to the semiconductor device 1 in this embodiment, the semiconductor chip 6 is mounted on the first surface 2a of the substrate 2 rather than attached to the height adjuster 5 on the side opposite to the substrate 2 as illustrated in FIG. 7. Even in such a structure which eliminates the height adjuster 5, the volume of the sealing member 7 does not easily increase when the thickness (volume) of only the portion of the first surface 2a of the substrate in contact with the adhesive layer 12 becomes large. Accordingly, the effect of hardening shrinkage decreases, whereby damage to the semiconductor chip 6 and warping of the semiconductor device 1 may lower.

According to this structure, load applied to the semiconductor chip 6 decreases, and the degree of the design freedom of the product may increase similarly to the first embodiment.

Sixth Embodiment

The semiconductor device 1 according to a sixth embodiment is now explained with reference to FIG. 8. Structures having functions identical or similar to the corresponding structures in the first through the fifth embodiments are given similar reference numbers, and the same explanation of those is not repeated. Structures other than the structures touched upon herein are the same as the corresponding structures in the first embodiment.

Figure 8:
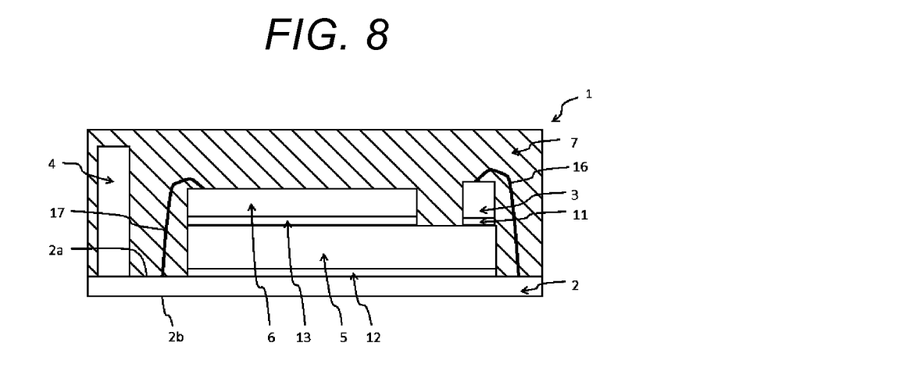
FIG. 8 is a cross-sectional view of a semiconductor device according to a sixth embodiment.

According to the semiconductor device 1 in this embodiment, the area of the height adjuster 5 overlapping with the substrate 2 is enlarged, and the controller chip 3 is attached not to the first surface 2a of the substrate 2 but to the height adjuster 5 on the side opposite to the substrate 2 and apart from the semiconductor chip 6 as illustrated in FIG. 8. The adhesive surface 11 is provided between the controller chip 3 and the height adjuster 5. According to the structure provided with the height adjuster 5, the volume of the sealing member 7 does not easily increase. Accordingly, the effect of hardening shrinkage decreases, wherefore damage to the semiconductor chip 6 and warping of the semiconductor device 1 may lower. In this specification, the phrase "overlapping with the substrate" refers to the condition facing to the substrate in the thickness direction of the substrate (that is, positioned inside the external shape of the substrate in the plan view), and includes such conditions overlapping with the substrate with a clearance (space) left between the substrate and the height adjuster, and overlapping with the substrate with another component interposed between the substrate and the height adjuster.

According to this structure, load applied to the semiconductor chip 6 decreases, and the degree of the design freedom of the product may increase similarly to the first embodiment.

Seventh Embodiment

The semiconductor device 1 according to a seventh embodiment is now explained with reference to FIGS. 9 through 11. Structures having functions identical or similar to the corresponding structures in the first through the sixth embodiments are given similar reference numbers, and the same explanation of those is not repeated. Structures other than the structures touched upon herein are the same as the corresponding structures in the first embodiment.

Figure 9:
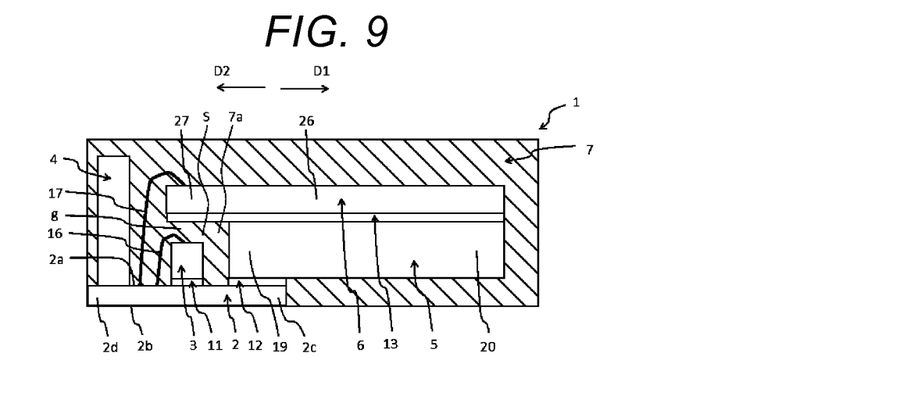
FIG. 9 is a cross-sectional view of a semiconductor device according to a seventh embodiment.

According to the semiconductor device 1 in this embodiment, the substrate 2 has a first end 2c, and a second end 2d disposed on the side opposite to the first end 2c as illustrated in FIG. 9.

As shown in FIG. 9, the height adjuster 5 is attached to the first end 2c of the substrate 2, and extends long toward the outside of the substrate 2. An example of the height adjuster 5 is larger than the substrate 2. The height adjuster 5 extends substantially in parallel with the substrate 2, for example, but is not required to have this configuration.

The height adjuster 5 has a pair of first part 19 and second part 20, for example. The first part 19 is attached to the first surface 2a of the substrate 2. The adhesive layer 12 is provided between the first part 19 and the substrate 2. The first part 19 is fixed to the first surface 2a of the substrate 2 via the adhesive layer 12.

As illustrated in FIG. 9, the second part 20 of the height adjuster 5 extends in the first direction D1 from the first part 19. The first direction D1 is a direction extending from the first part 19 toward the side opposite to the center (or the second end 2d) of the substrate 2. In another viewpoint, the first direction D1 is a direction moving away from the passive component 4 mounted on the substrate 2.

The second part 20 is positioned outside the substrate 2 in the extension direction of the substrate 2. In this specification, the phrase "positioned outside (or inside) the substrate in the extension direction of the substrate" refers to the condition positioned outside (or inside) the external shape of the substrate as viewed in the plan view (i.e., as viewed in the thickness direction of the substrate). Thus, the second part 20 corresponds to a portion projecting (protruding, overhanging) from the substrate 2, and does not overlap with the substrate 2 in the thickness direction of the substrate 2.

As illustrate in FIG. 9, the semiconductor chip 6 has a portion located outside the substrate 2 in the extension direction of the substrate 2, and a portion overlapping with the substrate 2. The semiconductor chip 6 has the first part 26 and the second part 27. The first part 26 is attached to the height adjuster 5. The adhesive layer 13 is provided between the first part 26 and the height adjuster 5. The first part 26 is fixed to the height adjuster 5 via the adhesive layer 13, for example.

The first part 26 of the semiconductor chip 6 extends throughout the first part 19 and the second part 20 of the height adjuster 5, for example. In other words, the first part 26 of the semiconductor chip 6 has a portion overlapping with the substrate 2 with the height adjuster 5 interposed therebetween, and a portion located outside the substrate 2 in the extension direction of the substrate 2.

The second part 27 of the semiconductor chip 6 extends from the first part 26 in a direction D2 opposite to the first direction D1. The second direction D2 is a direction extending toward the passive component 4 from the first end 2c of the substrate 2. In another viewpoint, the second direction D2 is a direction moving from the first part 26 of the semiconductor chip 6 toward the center of the substrate 2 in the plan view.

The second part 27 is positioned outside the height adjuster 5 in the extension direction of the substrate 2. The second part 27 corresponds to a portion projecting (protruding, overhanging) from the height adjuster 5, and does not overlap with the height adjuster 5 in the thickness direction of the substrate 2.

As illustrated in FIG. 9, the second part 27 of the semiconductor chip 6 faces the first surface 2a of the substrate 2. A space S (clearance, housing space) is formed between the second part 27 of the semiconductor chip 6 and the first surface 2a of the substrate 2.

According to this embodiment, the controller chip 3 is housed within the space S formed between the second part 27 of the semiconductor chip 6 and the substrate 2. Thus, at least a part of the controller chip 3 lies between the second part 27 of the semiconductor chip 6 and the substrate 2. The second part 27 of the semiconductor chip 6 expands toward above (below) the controller chip 3 to cover at least a part of the controller chip 3. The second part 27 of the semiconductor chip 6 faces the controller chip 3 on the side opposite to the substrate 2.

According to this embodiment, the sum of the thicknesses of the second adhesive layer 12 and the height adjuster 5 is larger than the sum of the thicknesses of the first adhesive layer 11 and the controller chip 3. Therefore, a clearance g (space) remains between the controller chip 3 and the second part 27 of the semiconductor chip 6, wherefore the controller chip 3 and the semiconductor chip 6 do not contact each other.

Figure 10:
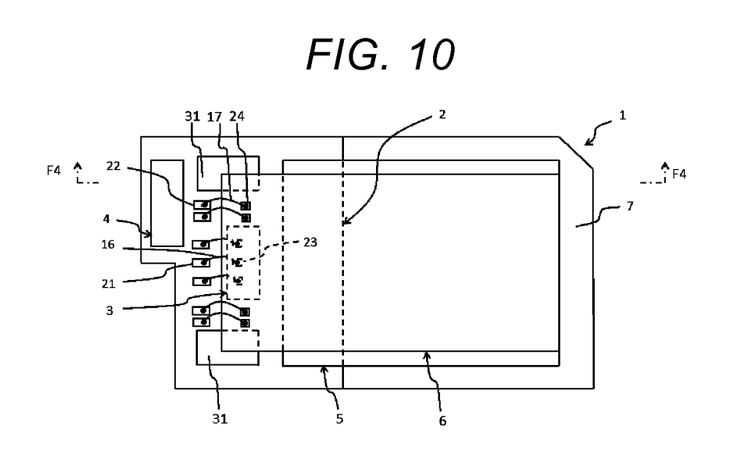
FIG. 10 is a plan view illustrating the internal structure of the semiconductor device shown in FIG. 9.

FIG. 10 is a plan view illustrating the internal structure of the semiconductor device 1 according to this embodiment.

Figure 11:
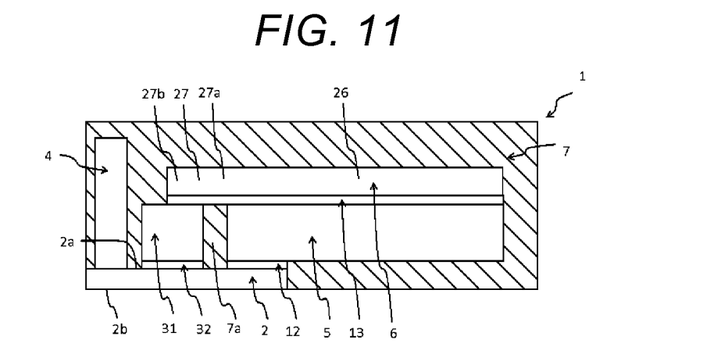
FIG. 11 is a cross-sectional view of the semiconductor device shown in FIG. 10 taken along line F4-F4.

FIG. 11 is a cross-sectional view of the semiconductor device shown in FIG. 10 taken along a line F4-F4. As illustrated in FIGS. 10 and 11, the semiconductor device 1 in this embodiment has a plurality of support members 31, for example. The support members 31 are provided on the first surface 2a of the substrate 2 at positions away from the height adjuster 5. The height adjuster 5 lies between the substrate 2 and the second part 27 of the semiconductor chip 6 to support the second part 27 of the semiconductor chip 6.

The plural support members 31 are located separately from each other at each end of the substrate 2 in the width direction thereof. Each of the support members 31 may be constituted either by a board made of metal, or by a substrate made of non-metal such as glass epoxy resin. Each thickness of the support members 31 is substantially equal to the thickness of the height adjuster 5.

The second part 27 of the semiconductor chip 6 has a first end 27a and a second end 27b. The first end 27a is located adjacent to the first part 26 of the semiconductor chip 6. The second end 27b is disposed on the side opposite to the first end 27a. The support members 31 support the second end 27b of the second part 27 of the semiconductor chip 6.

An adhesive layer 32 is provided between the support members 31 and the first surface 2a of the substrate 2. The support members 31 are fixed to the first surface 2a of the substrate 2 via the adhesive layer 32. The thickness of the adhesive layer 32 is substantially equal to the thickness of the adhesive layer 12 provided between the height adjuster 5 and the substrate 2.

As illustrated in FIGS. 9 and 11, apart 7a of the sealing member 7 is positioned between the second part 27 of the semiconductor chip 6 and the first surface 2a of the substrate 2 to fill in the space S between the second part 27 of the semiconductor chip 6 and the first surface 2a of the substrate 2.

According to the semiconductor device 1 having this structure, advantages such as increase in the degree of the design freedom, reduction of the material cost, and size enlargement of the semiconductor chip 6 mounted on the semiconductor device 1 (or miniaturization of the semiconductor device 1) may be achieved.

For the purpose of comparison, a structure which disposes the semiconductor chip 6 inside the height adjuster 5 is now discussed. According to this structure, the size of the semiconductor chip 6 is limited by the size of the height adjuster 5, wherefore the degree of the design freedom is not sufficiently high. Moreover, size enlargement of the semiconductor chip 6 and size reduction of the semiconductor device 1 are difficult to be achieved.

However, according to this embodiment, the height adjuster 5 includes the first part 19 attached to the first surface 2a of the substrate 2, and the second part 20 positioned outside the substrate 2 in the extension direction of the substrate 2. The semiconductor chip 6 is attached to the height adjuster 5.

According to this structure, the height adjuster 5 is provided in such a manner as to elongate the substrate 2, and the semiconductor chip 6 is supported by the height adjuster 5. In this case, the necessity of holding the semiconductor chip 6 by the substrate 2 is eliminated, wherefore the area of the substrate 2 is allowed to decrease. The substrate 2 occupies the largest proportion of the material cost of the semiconductor device 1. Accordingly, as an initial advantage, the structure may lower the material cost of the semiconductor device 1 by reduction of the area of the substrate 2.

Moreover, according to this embodiment, the semiconductor chip 6 includes the first part 26 attached to the height adjuster 5, and the second part 27 disposed outside the height adjuster 5 in the extension direction of the substrate 2 and facing to the first surface 2a of the substrate 2. According to this structure of the embodiment, the semiconductor chip 6 overhangs from the height adjuster 5 into the step formed by the substrate 2 and the height adjuster 5. Thus, the degree of freedom in positioning the semiconductor chip 6 increases, wherefore the degree of the design freedom of the semiconductor device 1 may improve. Furthermore, the size of the semiconductor chip 6 to be mounted may increase.

According to this embodiment, the second part 27 of the semiconductor chip 6 faces the controller chip 3 on the side opposite to the substrate 2. In other words, the component is disposed immediately below the overhanging portion of the semiconductor chip 6. According to this structure, the semiconductor chip 6 may be enlarged up to the range covering the electronic component, wherefore the size of the semiconductor chip 6 may further increase.

According to this embodiment, the semiconductor device 1 has the support members 31 disposed on the first surface 2a of the substrate 2 away from the height adjuster 5 and interposed between the substrate 2 and the second part 27 of the semiconductor chip 6. According to this structure, the second part 27 of the semiconductor chip 6 may be supported in a stable condition. For example, in the case of the structure which attaches the bonding wires 17 to the second part 27 of the semiconductor chip 6, the support members 31 supporting the second part 27 of the semiconductor chip 6 may increase the connection stability of the bonding wires 17.

According to this embodiment, the second part 27 of the semiconductor chip 6 has the first end 27a adjacent to the first part 26 of the semiconductor chip 6, and the second end 27b disposed on the side opposite to the first end 27a. The support members 31 support the second end 27b of the second part 27 of the semiconductor chip 6. According to this structure, the second part 27 of the semiconductor chip 6 may be supported in a further stable condition.

Eighth Embodiment

The semiconductor device 1 according to an eighth embodiment is now explained with reference to FIG. 12. Structures having functions identical or similar to the corresponding structures in the seventh embodiment are given similar reference numbers, and the same explanation of those is not repeated. Structures other than the structures touched upon herein are the same as the corresponding structures in the seventh embodiment.

Figure 12:
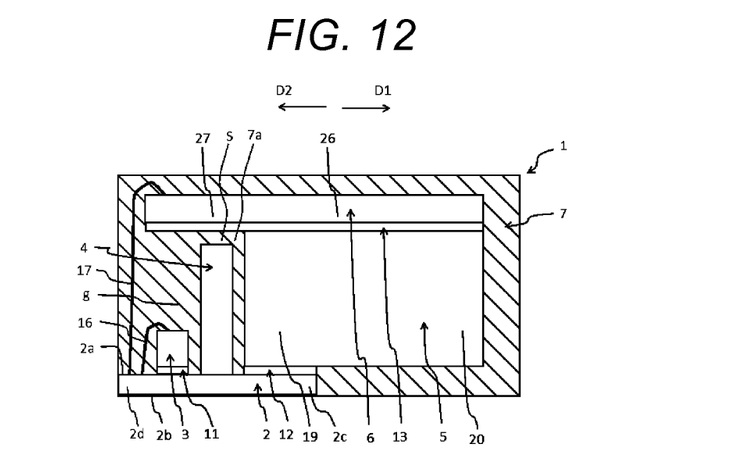
FIG. 12 is a cross-sectional view of a semiconductor device according to an eighth embodiment.

According to this embodiment, the passive component 4 is housed in the space S formed between the second part 27 of the semiconductor chip 6 and the substrate 2 similarly to the controller chip 3 as illustrated in FIG. 12. Thus, at least a part of the passive component 4 lies between the second part 27 of the semiconductor chip 6 and the substrate 2. The second part 27 of the semiconductor chip 6 expands toward above (or below) the passive component 4, and covers at least a part of the passive component 4. The second part 27 of the semiconductor chip 6 faces the passive component 4 on the side opposite to the substrate 2.

According to this structure, improvement of the degree of the design freedom, reduction of the material cost, and size enlargement of the semiconductor chip 6 mounted on the semiconductor device 1 (or size reduction of the semiconductor device 1) may be achieved similarly to the seventh embodiment. The size of the semiconductor chip 6 may be increased up to the size of the external shape of the semiconductor device 1, for example.

Ninth Embodiment

The semiconductor device 1 according to a ninth embodiment is now explained with reference to FIG. 13. Structures having functions identical or similar to the corresponding structures in the first through the eighth embodiments are given similar reference numbers, and the same explanation of those is not repeated. Structures other than the structures touched upon herein are the same as the corresponding structures in the seventh embodiment.

Figure 13:
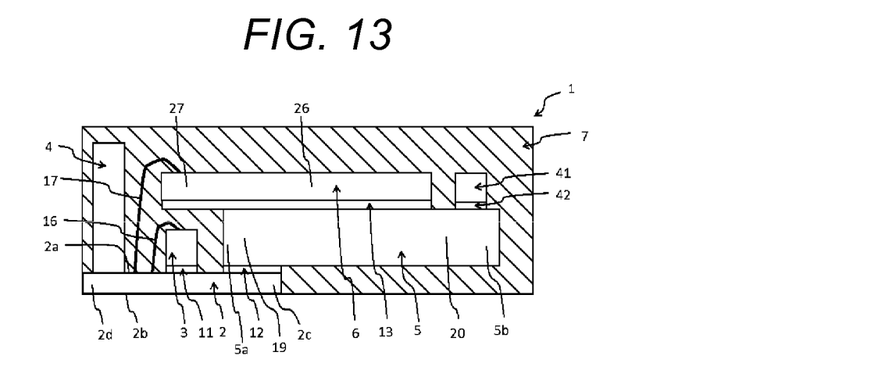
FIG. 13 is a cross-sectional view of a semiconductor device according to a ninth embodiment.

As illustrated in FIG. 13, the semiconductor device 1 in this embodiment includes a component 41 in addition to the structure of the seventh embodiment, for example. The component 41 faces the second part 20 of the height adjuster 5. The component 41 may be attached to the second part 20 of the height adjuster 5 by an adhesive layer 42, for example, or may be supported by the sealing member 7 without contact with the second part 20 of the height adjuster 5.

More specifically, the height adjuster 5 has a first end 5*a* and a second end 5*b*. The first end 5*a* is fixed to the substrate 2. The second end 5*b* is disposed on the side opposite to the first end 5*a* and positioned at the end of the semiconductor device 1. The component 41 faces the second end 5*b* of the height adjuster 5. The component 41 is constituted by an antenna, for example, but may be other components.

According to this structure, improvement of the degree of the design freedom, reduction of the material cost, and size enlargement of the semiconductor chip 6 mounted on the semiconductor device 1 (or size reduction of the semiconductor device 1) may be achieved similarly to the seventh embodiment. Furthermore, the structure of the semiconductor chip 6 in this embodiment which overhangs from the height adjuster 5 allows mounting of the component 41 on the height adjuster 5, while increasing the size of the semiconductor chip 6.

Modified examples of the semiconductor device 1 according to the seventh through ninth embodiments are now explained with reference to FIGS. 14 and 15.

Figure 14:
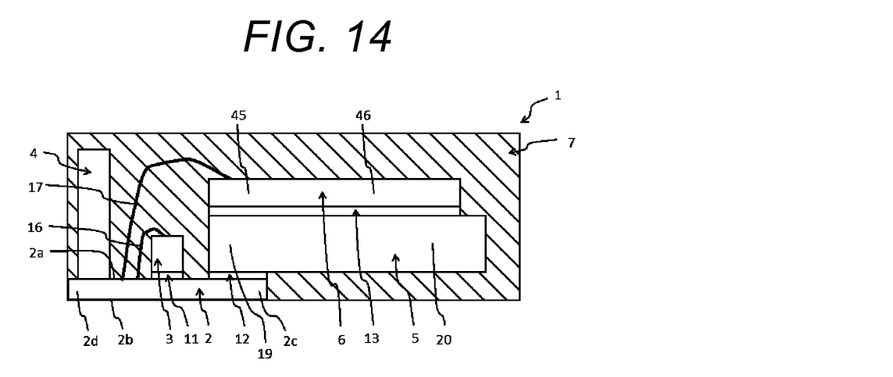
FIG. 14 is a cross-sectional view of a semiconductor device according to a first modified example of the ninth embodiment.

FIG. 14 illustrates the semiconductor device 1 according to a first modified example. As shown in FIG. 14, the semiconductor chip 6 includes a first part 45 overlapping with the substrate 2 in the thickness direction of the substrate 2, and a second part 46 disposed outside the substrate 2 in the extension direction of the substrate 2. The semiconductor chip 6 in this modified example is located inside the external shape of the height adjuster 5.

Figure 15:
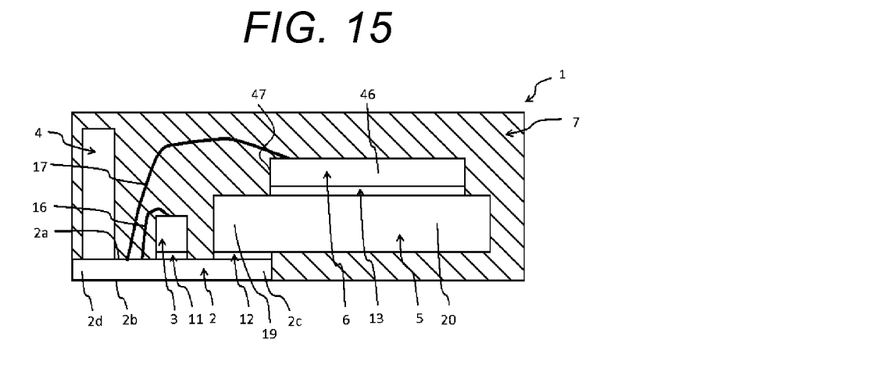
FIG. 15 is a cross-sectional view of a semiconductor device according to a second modified example of the ninth embodiment.

FIG. 15 illustrates the semiconductor device 1 according to a second modified example. As shown in FIG. 15, the semiconductor chip 6 includes an end surface 47 positioned substantially on the plane aligned with the edge of the substrate 2 in the thickness direction of the substrate 2, and the part 46 disposed outside the substrate 2 in the extension direction of the substrate 2. The semiconductor chip 6 in this modified example is located inside the external shape of the height adjuster 5.

According to these structures, improvement of the degree of the design freedom, reduction of the material cost, and size enlargement of the semiconductor chip 6 mounted on the semiconductor device 1 (or size reduction of the semiconductor device 1) may be similarly achieved.

Tenth Embodiment

An electronic apparatus 51 according to a tenth embodiment is hereinafter described with reference to FIGS. 16 through 18. Structures having functions identical or similar to the corresponding structures in the first through the ninth embodiments are given similar reference numbers, and the same explanation of those is not repeated. Structures other than the structures touched upon herein are the same as the corresponding structures in the ninth embodiment.

Figure 16:
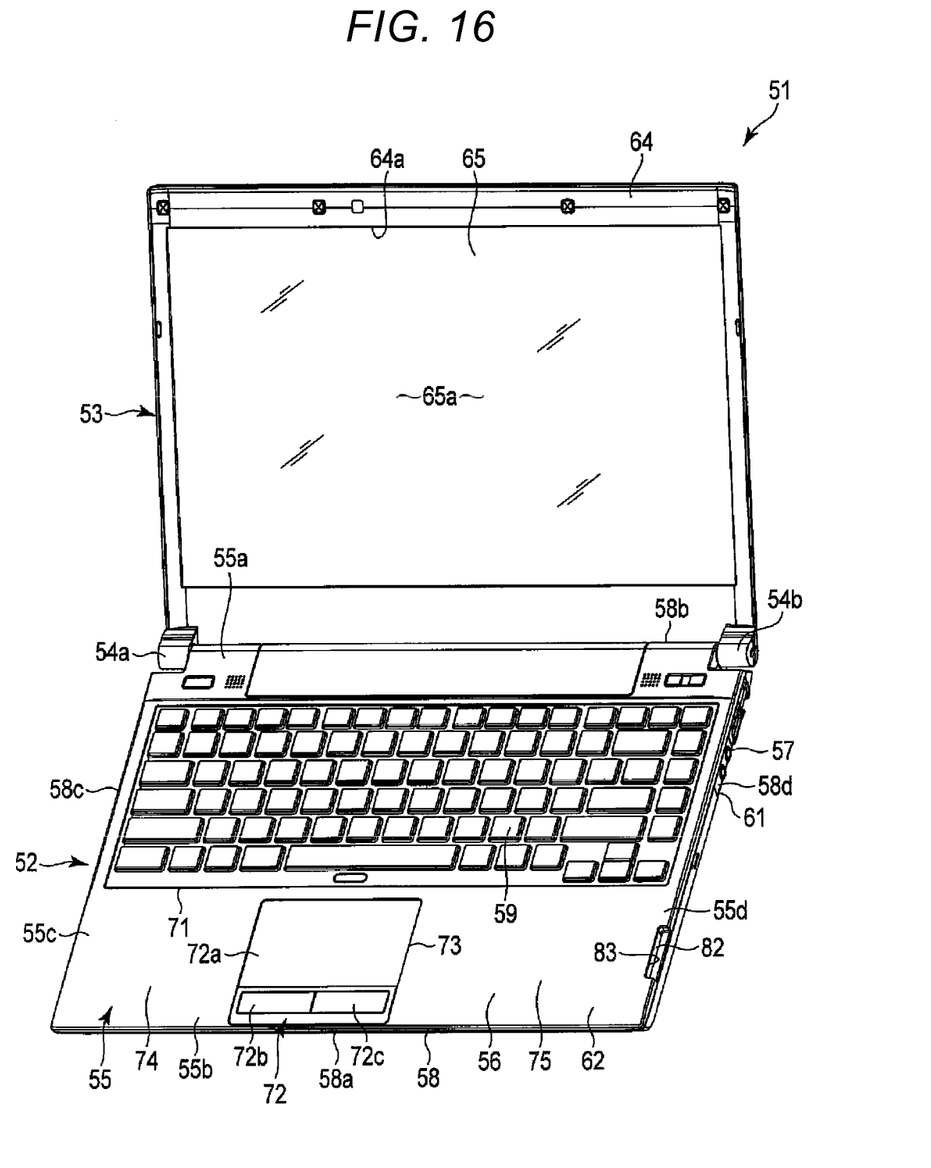
FIG. 16 is a perspective view of an electronic apparatus according to a tenth embodiment.

FIG. 16 illustrates the whole configuration of the electronic apparatus 51 according to this embodiment. For example, the electronic apparatus 51 is a notebook personal computer. In addition, the electronic apparatuses to which this embodiment can be applied are not limited to thereto. For example, this embodiment can be widely applied to various electronic apparatuses including TV image receivers, mobile phones (including smart phones), tablet-type devices.

As illustrated in FIG. 16, the electronic apparatus 51 includes a main unit 52, a display unit 53, and hinges 54*a* and 54*b*. The main unit 52 (first unit) is the main body of the electronic apparatus on which a main board is mounted. The main unit 52 has a first case 55. The first case 55 has an upper wall 56, a lower wall 57, and a peripheral wall 58, and has a flat box shape.

The bottom wall 57 of the electronic apparatus 51 faces a table surface when the electronic apparatus 51 is mounted on the table surface (external mounting surface). The bottom wall 57 is substantially parallel to the table surface. The top wall 56 is substantially parallel to the bottom wall 57 (i.e., substantially in the horizontal direction) to form an empty space with respect to the bottom wall 57. A keyboard 59 is attached to the top wall 56. The keyboard 59 is an example of an "input unit". The input unit is not limited to the keyboard, but it may be, for example, a touch-panel-type input device. The circumferential wall 58 is erected with respect to the bottom wall 57 to connect the circumferential edge of the bottom wall 57 and the circumferential edge of the top wall 56.

The first case 55 has a lower cover 61 and an upper cover 62. The lower cover 61 includes the bottom wall 57 and a part of the circumferential wall 58. The upper cover 62 includes the top wall 56 and a part of the circumferential wall 58. The upper cover 62 is assembled with the lower cover 61 to form the first case 55.

The first case 55 has a first end 55*a* which is rotatably connected to the display unit 53, and a second end 55*b* which is located at the side opposite to the first end 55*a*. The circumferential wall 58 has a front wall 58*a*, a rear wall 58*b*, a left side wall 58*c*, and a right side wall 58*d*. The front wall 58*a* extends in the width direction (left/right direction) of the first case 55 at the second end 55*b*. The rear wall 58*b* extends in the width direction of the first case 55 at the first end 55*a*. The left side wall 58*c* and the right side wall 58*d* each extend in the depth direction (forward/backward direction) of the first case 55 to connect the ends of the front wall 58*b* and the rear wall 58*b*.

The display unit 53 (second unit) is rotatably (openably) connected with the first end 55*a* of the main unit 52 by the hinges 54*a* and 54*b*. The display unit 53 can be rotated between the closing position where the display unit 53 is laid down to cover the main unit 52 from the upper side and an opening position where the display unit 53 is erected with respect to the main unit 52.

As illustrated in FIG. 16, the display unit 53 includes a second case 64, and a display panel 65 received in the second case 64. A display screen 65*a* of the display panel 65 may be exposed to an external portion through an opening portion 64*a* installed on the front wall of the second case 64.

As illustrated in FIG. 16, the top wall 56 has a keyboard attachment portion 71 to which the keyboard 59 is attached, a touch pad attachment portion 73 to which a touch pad unit 72 is attached, and a first palm rest 74 and a second palm rest 75. The keyboard attachment portion 71 extends to be substantially parallel to the front wall 58a and the rear wall 58b in the width direction of the first case 55, and extend from the vicinity of the left side wall 58c to the vicinity of the right side wall 58d.

The keyboard attachment portion 71 is formed by recessing a portion of the inner side of the first case 55 from the first palm rest 74 and the second palm rest 75 such that the keyboard 59 is mounted within the recess. Therefore, the height surface (for example, key top) of the keyboard 59 attached to the keyboard attachment portion 71 is substantially equal to or slightly higher than the height of the surface of the first palm rest 74 and the height of the surface of the second palm rest 75.

The touch pad unit 72 is attached to the touch pad attachment portion 73. The touch pad unit 72 has a touch pad 72a which is a pointing device and, for example, a pair of buttons 72b and 72c. The touch pad attachment portion 73 is provided between the keyboard attachment portion 71 and the front wall 58a.

For example, similarly to the keyboard attachment portion 71, the touch pad attachment portion 73 is formed by recessing a portion of the inner side of the first case 55 with respect to the first palm rest 74 and the second palm rest 75, and the touch pad unit 72 is mounted by using the recessed portion. Therefore, the height of the surface of the touch pad unit 72 which is attached to the touch pad attachment portion 73 is substantially equal to the height of the surface of the first palm rest 74 and the height of the surface of the second palm rest 75.

In addition, instead of the above configuration, the touch pad attachment portion 73 may have an opening portion where the touch pad unit 72 disposed at inner side of the first case 55 is exposed without recession with respect to the first palm rest 74 or the second palm rest 75. In this case, the touch pad unit 72 is attached to the touch pad attachment portion 73 from the inner side of the first case 55.

As illustrated in FIG. 16, the first case 55 has a third end 55c and a fourth end 55d corresponding to one and the other ends of the first case 55 in the longitudinal direction (width direction), respectively. The third end 55c includes, for example, the left side wall 58c. The fourth end 55d includes, for example, the right side wall 58d.

User's hands are rested on the first palm rest 74 and the second palm rest 75, for example, during the manipulation of the keyboard 59. The first palm rest 74 and the second palm rest 75 are provided between the keyboard attachment portion 71 and the front wall 58a. The first palm rest 74 extends between the third end 55c and the touch pad unit 72. The second palm rest 75 extends between the fourth end 54d and the touch pad unit 72.

Figure 17:
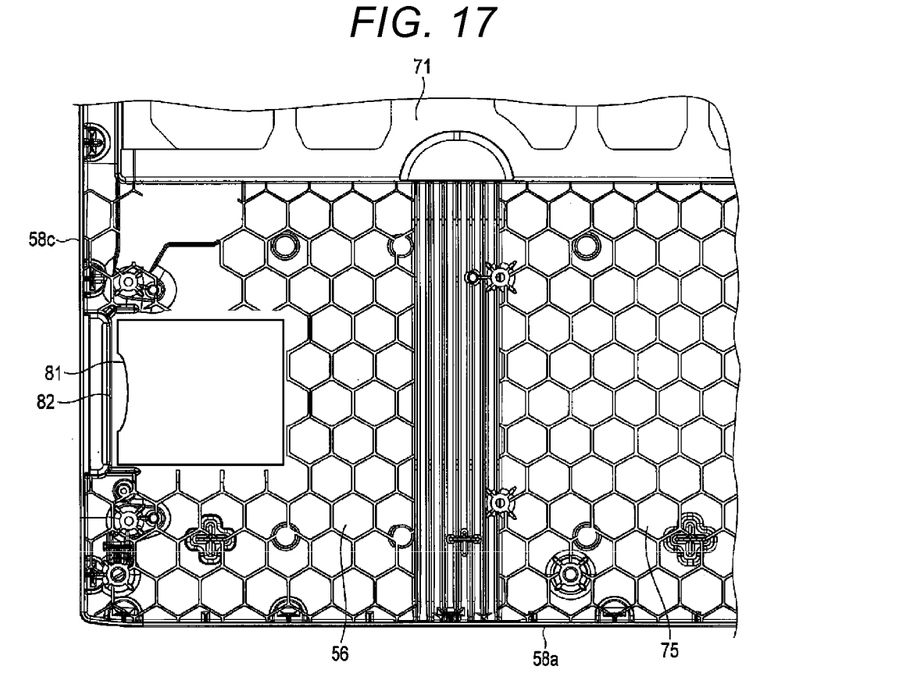
FIG. 17 is a plan view illustrating the inside surface of an upper cover of the electronic apparatus shown in FIG. 16.

As illustrated in FIG. 17, a card slot 81 is provided in the first case 55. For example, the card slot 81 is an SD card slot, but other card slots may be used. The card slot 81 faces the inner surface of the second palm rest 75. The card slot 81 is oriented toward an opening portion 82 opened in the circumferential wall 58 of the first case 55. The card-type semiconductor device 1 is attached to and detached from the card slot 81 through the opening 82.

Figure 18:
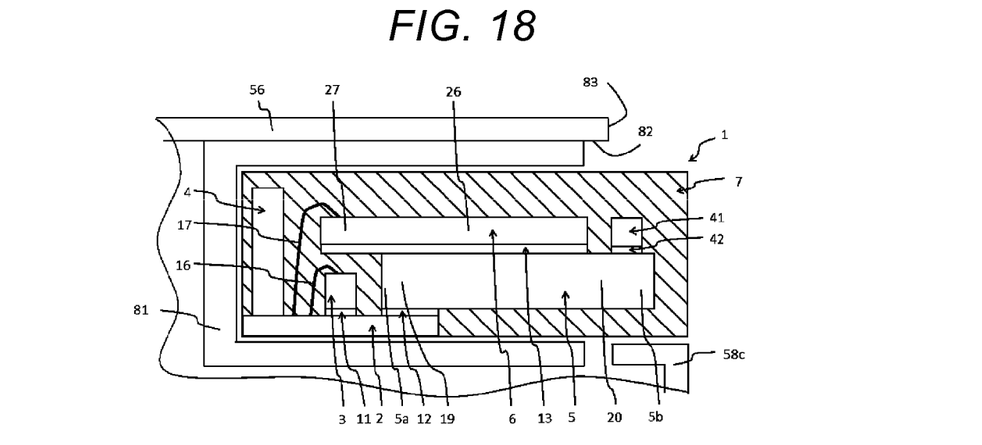
FIG. 18 is a cross-sectional view illustrating the electronic apparatus shown in FIG. 16 to which the semiconductor device is attached.

FIG. 18 is a cross-sectional view of the electronic apparatus 51 where the semiconductor device 1 attached to the card slot 81. As illustrated in FIGS. 16 and 18, a cutout portion 83 is formed corresponding to the opening portion 82 of the top wall 56. Therefore, the portion corresponding to the opening 82 of the top wall 56 is recessed toward an inner side of the first case 55 with respect to the right side wall 58d. Therefore, as illustrated in FIG. 18, the upper of the end of the semiconductor device 1 attached to the card slot 81 is opened. For example, in this embodiment, the conductive top wall 56 is not located on the upper of the component 41 (for example, antenna) of the semiconductor device 1. Therefore, for example, the communication performance of the antenna can improve. In addition, the semiconductor device 1 mounted on the electronic apparatus 51 is not limited to the semiconductor device 1 including the component 41. Any types of the semiconductor device 1 shown in the first through ninth embodiments may be mounted on the electronic apparatus 51.

According to this configuration, improvement of the degree of the design freedom of the semiconductor device 1, and size enlargement of the semiconductor chip 6 mounted on the semiconductor device 1 (or size reduction of the semiconductor device 1) may be achieved similarly to the first through ninth embodiments. Furthermore, the semiconductor chip 6 in this embodiment overhangs from the height adjuster 5 so as to locate the component 41 of the semiconductor device 1 at a specific position. According to this structure, the component 41 may be disposed at a particular position while maintaining or enlarging the size of the semiconductor chip 6. This advantage considerably contributes to improvement of the degree of the design freedom of the semiconductor device 1.

According to the first through tenth embodiments described herein, therefore, the degree of the design freedom of the semiconductor device 1 may improve.

The embodiments discussed herein are not presented for any restrictive purposes. Obviously, the embodiments may be given various modifications and changes.

For example, plural semiconductor chips laminated on each other may be employed as the semiconductor chip 6 attached to the height adjuster 5 rather than the one semiconductor chip.

While certain embodiments have been described, these embodiments have been presented by way of example only, and are not intended to limit the scope of the inventions. Indeed, the novel embodiments described herein may be embodied in a variety of other forms; furthermore, various omissions, substitutions and changes in the form of the embodiments described herein may be made without departing from the spirit of the inventions. The accompanying claims and their equivalents are intended to cover such forms or modifications as would fall within the scope and spirit of the inventions.

What is claimed is:

1. A semiconductor device, comprising:
   a substrate;
   a first adhesive layer mounted on a surface of the substrate;
   a height adjuster mounted on and in contact with the first adhesive layer, and not being electrically connected with the substrate;
   a semiconductor chip mounted on the height adjuster via a second adhesive layer;
   an electronic component mounted on the surface of the substrate via a third adhesive layer and disposed apart from the height adjuster and the semiconductor chip, the electronic component being configured to control the semiconductor chip;
   bonding wires electrically connecting a conductive pad disposed on the substrate and a conductive pad disposed on the semiconductor chip and electrically connecting a conductive pad disposed on the substrate and a conductive pad disposed on the electronic component; and
   a sealing member covering the substrate, the first adhesive layer, the height adjuster, the second adhesive layer, the semiconductor chip, the third adhesive layer, the electronic component, and the bonding wires, wherein the length of the electronic component in a first direction corresponding to the thickness direction of the substrate is larger than the length of the semiconductor chip in the first direction, and the sum of the lengths of the height adjuster, the second adhesive layer, and the semiconductor chip in the first direction is larger than the length of the electronic component in the first direction.

2. The device according to claim 1, wherein the semiconductor chip is mounted in such a manner that the center of the semiconductor chip is offset from the center of the height adjuster.

3. The device according to claim 2, wherein the sum of the lengths of the height adjuster and the first adhesive layer in the first direction is larger than the sum of the lengths of the electronic component and the third adhesive layer in the first direction.

4. The device according to claim 1, wherein a portion of the semiconductor chip is not supported by the height adjuster.

5. The device according to claim 1, further comprising a second semiconductor chip mounted on the first semiconductor chip via a fourth adhesive layer and a portion of the second semiconductor chip is not supported by the first semiconductor chip.

6. The device according to claim 1, wherein a portion of the height adjuster is not supported by the substrate.

7. The device according to claim 6, wherein a portion of the semiconductor chip is not supported by the height adjuster and said portion is disposed above the electronic component.

8. The device according to claim 7, further comprising:
a pair of support members mounted on the substrate on which respective edges of said portion are supported,
wherein the electronic component is disposed between the pair of support members.

9. The device according to claim 7, further comprising:
an antenna mounted on the height adjuster.

10. The device according to claim 6, wherein a first side of the semiconductor chip facing the electronic component and a first side of the height adjuster facing the electronic component are aligned, and a second side of the semiconductor chip opposite the first side of the semiconductor chip and a second side of the height adjuster opposite the first side of the height adjuster are not aligned.

11. The device according to claim 6, wherein a first side of the semiconductor chip facing the electronic component and a first side of the height adjuster facing the electronic component are not aligned, and a second side of the semiconductor chip opposite the first side of the semiconductor chip and a second side of the height adjuster opposite the first side of the height adjuster are not aligned.

12. The device according to claim 1, further comprising:
a passive component mounted on the substrate and covered by the sealing member, having a length in the first direction that is greater than the sum of the lengths of the height adjuster, the second adhesive layer, and the semiconductor chip in the first direction.

13. The device according to claim 1, wherein the sealing member is a thermosetting resin.

* * * * *